United States Patent
Ishida et al.

(10) Patent No.: US 6,628,925 B1
(45) Date of Patent: Sep. 30, 2003

(54) RECEIVER/TRANSMITTER APPARATUS

(75) Inventors: Masaaki Ishida, Chiba-ken (JP); Yasuhiro Kanekiyo, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 136 days.

(21) Appl. No.: 09/662,703

(22) Filed: Sep. 15, 2000

(30) Foreign Application Priority Data

Sep. 17, 1999 (JP) .......................... 11-263698
Sep. 17, 1999 (JP) .......................... 11-263700

(51) Int. Cl.$^7$ ................................ H04B 1/38
(52) U.S. Cl. ............... 455/73; 455/90.2; 455/90.3; 455/91; 455/128
(58) Field of Search .................. 455/73, 78, 86, 455/296, 255, 258, 313, 318, 323, 90.2, 90.3, 128, 91

(56) References Cited

U.S. PATENT DOCUMENTS 5,513,382 A * 4/1996 Agahi-Kesheh et al. ...... 455/83
5,689,819 A * 11/1997 Nashimura et al. ........... 455/86

* cited by examiner

*Primary Examiner*—William Trost
*Assistant Examiner*—Brandon J Miller
(74) *Attorney, Agent, or Firm*—Oblon, Spivak, McClelland, Maier & Neustadt, P.C.

(57) ABSTRACT

A receiver/transmitter apparatus that promotes mass productivity and miniaturization. The receiver/transmitter apparatus is provided with a transmitter circuit having a first mixer for mixing a transmission signal and an oscillating signal, an oscillator for generating the oscillating signal, and a receiver circuit having a second mixer for mixing a received signal and the oscillating signal. The receiver/transmitter apparatus has the transmitter circuit formed on a side region of a front surface of a common substrate on whose rear surface a ground electrode is formed. The receiver circuit is formed on the front surface of the substrate, on the other side region, and the oscillator is formed on a center region on the front surface of the substrate, between the transmitter and the receiver.

19 Claims, 5 Drawing Sheets

RECEIVER/TRANSMITTER APPARATUS

CROSS REFERENCE TO THE RELATED APPLICATION

The subject application is related to subject matter disclosed in the Japanese Patent Application No.Hei11-263698 filed in Sep. 17, 1999 in Japan and the Japanese Patent Applications No.Hei11-263700 filed in Sep. 17, 1999 in Japan, to which the subject application claims priority under the Paris Convention and which are incorporated by reference herein.

BACKGROUND OF THE INVENTION

1. Field of the Invention

The present invention is related to an improved receiver/transmitter apparatus by making use of frequencies of microwaves, millimeter waves or the like.

2. Description of the Related Art

A receiver/transmitter apparatus in accordance with a conventional technique will be explained with reference to FIG. 1. The reference 21 designates a transmitter circuit whose input terminal 211 is provided for receiving a transmission signal. The transmission signal as received is amplified by an amplifier 212 and is inputted to a mixer 213. In the mixer 213, the transmission signal is mixed with a local oscillating signal supplied from a local oscillator 22 and given the frequency conversion into a high transmission frequency. After the frequency conversion, the transmission signal is amplified by an amplifier 214 and outputted through an ouput terminal 215.

On the other hand, a received signal is input through an input terminal 231 of the receiver circuit 23, amplified by an amplifier 232 and transmitted to a mixer 233. In the mixer 233, the received signal is mixed with the local oscillating signal as supplied from the local oscillator 22 and subjected to frequency conversion processing into a lower reception frequency. The transmission signal after the frequency conversion is amplified by an amplifier 234 in order to output through an ouput terminal 235.

The receiver/transmitter apparatus in accordance with the conventional technique is implemented with separate cases for accommodating the transmitter circuit, the receiver circuit and the local oscillator respectively while the respective circuits are connected to each other by means of the respective cases, cables, connectors and so forth. For this reason, the entire volume of the receiver/transmitter apparatus tends to increase. Furthermore, since the respective cases are connected by means of cables and the like, the power loss tends to increase. As a result, it becomes difficult to put the receiver/transmitter apparatus into massproduction and cut down the price.

SUMMARY OF THE INVENTION

The present invention has been made in order to solve the shortcomings as described above. It is an object of the present invention to provide a receiver/transmitter apparatus which can be manufactured in massproduction at a low cost.

In brief, the above and other objects and advantages of the present invention are provided by a new and improved receiver/transmitter apparatus comprising:

a substrate having a rear surface on which a ground electrode is formed;

a local oscillator formed on said substrate for generating a local oscillating signal;

a transmitter formed on said substrate and having a mixer for mixing a transmission signal and said local oscillating signal; and a receiver circuit formed on said substrate and having a mixer for mixing a received signal and said local oscillating signal, wherein said local oscillator is arranged in a position between said transmitter circuit and said receiver circuit in order to lessen interference between said transmitter circuit and said receiver circuit.

In a preferred embodiment, further improvement resides in that an electric power source circuit for supplying a bias voltage to the transmitter circuit, the local oscillator and the receiver circuit is formed on said substrate between said transmitter circuit and said receiver circuit.

In a preferred embodiment, further improvement resides in that substrate has a principal surface on which a ground electrode is formed. In a preferred embodiment, further improvement resides in that said through hole sequence is formed along a signal transmission line through which the transmission signal and the received signal are transferred through signal transmission line between the ground electrode formed on the surface of the substrate and the ground electrode formed on the rear surface of the substrate.

In a preferred embodiment, further improvement resides in that said substrate is composed of a plurality of sublayers each of which has a principal surface on which a ground electrode is formed and a rear surface on which a ground electrode is formed, and wherein a signal transmission line is provided in each sublayer for transferring the transmission signal and/or the received signal.

In accordance with a further aspect of the present invention, the above and other objects and advantages of the present invention are provided by a new and improved receiver/transmitter apparatus including:

a substrate having a rear surface on which a ground electrode is formed;

a local oscillator formed on the substrate for generating a local oscillating signal;

a transmitter formed on the substrate and having a mixer for mixing a transmission signal and the local oscillating signal; and a receiver circuit formed on the substrate and having a mixer for mixing a received signal and the local oscillating signal, such that a plurality of through holes through the substrate in the form of through hole sequences in order to section the substrate into first and second substrate regions, and the transmitter circuit and the receiver circuit are located in the first and second substrate regions respectively.

In a preferred embodiment, further improvement resides in that the through hole sequences are arranged in order to form a third substrate region as well as the first and second substrate regions, and the local oscillator, the transmitter circuit and the receiver circuit are located in the first and second substrate regions respectively and isolated from each other by the first and second substrate regions.

In a preferred embodiment, further improvement resides in that said through hall sequences are arranged in order to form a third substrate region as well as said first and second substrate regions, and wherein said local oscillator, said transmitter circuit and said receiver circuit are located in said first and second substrate regions respectively and isolated from each other by means of said first and second substrate regions.

In a preferred embodiment, further improvement resides in that an electric power source circuit for supplying a bias voltage to the transmitter circuit, the local oscillator and the receiver circuit is formed on said substrate between said transmitter circuit and said receiver circuit.

In a preferred embodiment, further improvement resides in that the through hole sequence is formed along a signal transmission line through which the transmission signal or the received signal are transmitted.

In a preferred embodiment, further improvement resides in that the through hole sequence is extending to reach to the vicinity of one edge of the substrate.

In a preferred embodiment, further improvement resides in that the through hole sequence is extending to reach to the vicinities of the opposite edges of the substrate.

In a preferred embodiment, further improvement resides in that substrate has a principal surface on which a ground electrode is formed. In a preferred embodiment, further improvement resides in that the through hole sequence is formed along a signal transmission line through which the transmission signal and the received signal are transferred through signal transmission line between the ground electrode formed on the surface of the substrate and the ground electrode formed on the rear surface of the substrate.

In a preferred embodiment, further improvement resides in that said substrate is composed of a plurality of sublayers each of which has a principal surface on which a ground electrode is formed and a rear surface on which a ground electrode is formed, and wherein a signal transmission line is provided in each sublayer for transferring the transmission signal and/or the received signal.

In accordance with a further aspect of the present invention, the above and other objects and advantages of the present invention are provided by a new and improved receiver/transmitter apparatus comprising:

a substrate having a rear surface on which a ground electrode is formed;

a local oscillator formed on said substrate for generating a local oscillating signal;

a transmitter formed on said substrate and having a mixer for mixing a transmission signal and said local oscillating signal; and a receiver circuit formed on said substrate and having a mixer for mixing a received signal and said local oscillating signal, wherein the mixer of said transmitter circuit and the mixer of said receiver circuit are positioned in opposite locations of said substrate to each other with said local oscillator interveneing between the mixer of said transmitter circuit and the mixer of said receiver circuit.

In a preferred embodiment, further improvement resides in that substrate has a principal surface on which a ground electrode is formed. In a preferred embodiment, further improvement resides in that the through hole sequence is formed along a signal transmission line through which the transmission signal and the received signal are transferred through signal transmission line between the ground electrode formed on the surface of the substrate and the ground electrode formed on the rear surface of the substrate.

In a preferred embodiment, further improvement resides in that said substrate is composed of a plurality of sublayers each of which has a principal surface on which a ground electrode is formed and a rear surface on which a ground electrode is formed, and wherein a signal transmission line is provided in each sublayer for transferring the transmission signal and/or the received signal.

In a preferred embodiment, further improvement resides in that an electric power source circuit for supplying a bias voltage to the transmitter circuit, the local oscillator and the receiver circuit is formed on said substrate between said transmitter circuit and said receiver circuit.

BRIEF DESCRIPTION OF DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DETAILED DESCRIPTION OF EMBODIMENTS

The present invention is related to a receiver/transmitter apparatus which is driven at very high frequencies which are no lower than 10 GHz such as the KU band, i.e., 12 to 14 GHz for use in BS converters or CS converters, 20 to 40 GHz for use in PTMP (Point-to-MultiPoint) communication systems and so forth. Particularly, the embodiments of the present invention as explained in the followings are directed to receiver/transmitter apparatuses to be implemented within a PTMP communication system.

Figure 1:
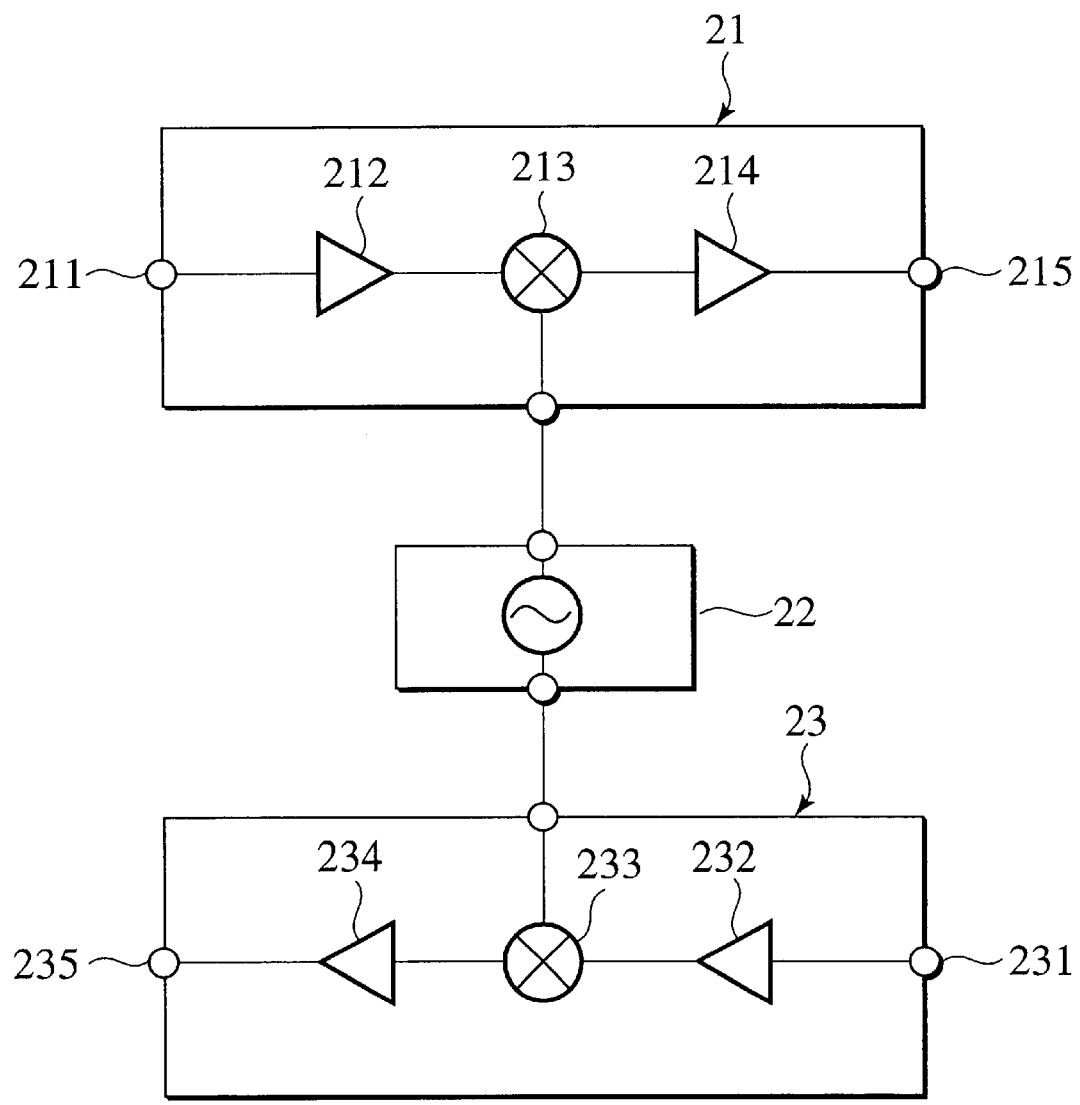
FIG. 1 is a schematic plan view for explaining a receiver/transmitter apparatus in accordance with an exemplary prior art technique.
Figure 2:
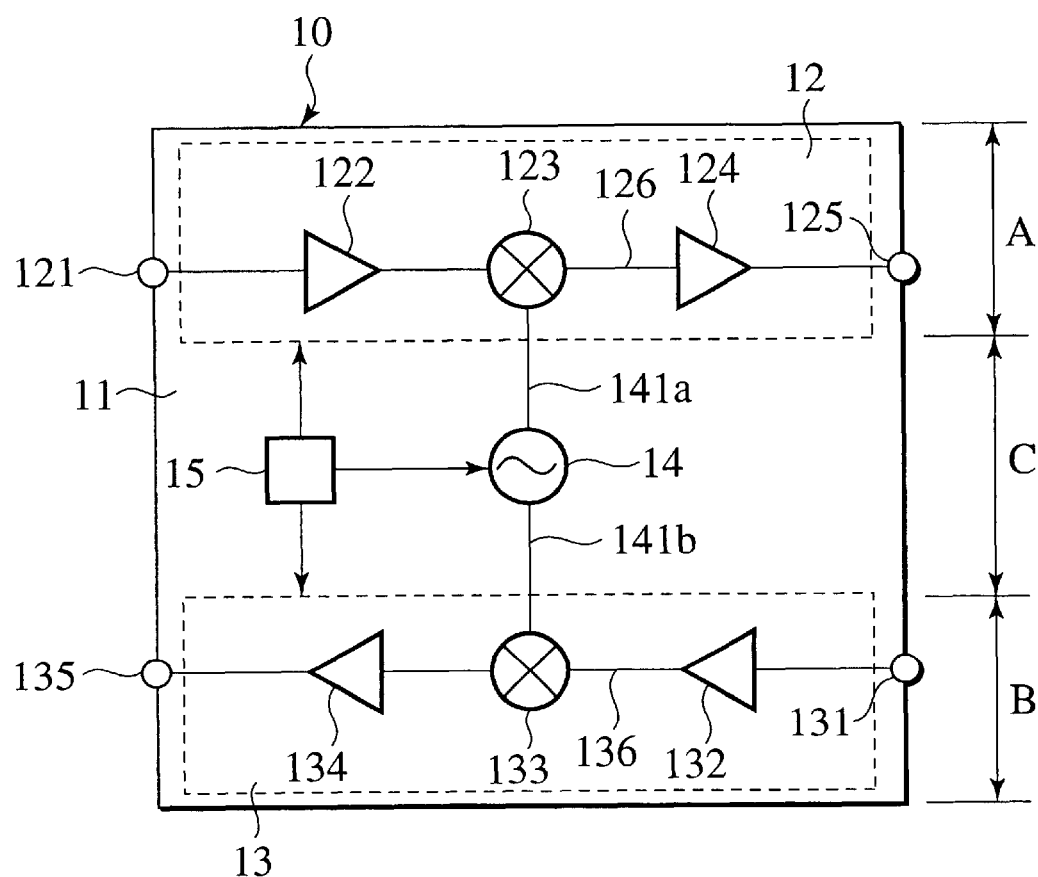
FIG. 2 is a schematic plan view for explaining a receiver/transmitter apparatus in accordance with an embodiment the present invention.

An embodiment in accordance with the present invention will be explained with reference to FIG. 2 which is a schematic plan view showing the structure of the embodiment. The reference 10 designates a circuit board structure. The circuit board structure is composed of a multilayer substrate 11 is implemented with necessary circuitry for realizing the operation of the receiver/transmitter device. The substrate 11 is segmented in three regions, i.e., regions A and B located in the upper and lower positions in the figure and a region C located in the center and, for example, is mounted upon a casing (not shown in the figure).

Provided upon the region A of the substrate 11 is a transmitter circuit 12. The transmitter circuit 12 is composed of an input terminal 121, an amplifier 122, a mixer 123, an amplifier 124, an output terminal 125, signal transmission lines 126 for making connection thereamong and so forth.

Provided upon the region B of the substrate 11 is a receiver circuit 13. The receiver circuit 13 is composed of an input terminal 131, an amplifier 132, a mixer 133, an amplifier 134, an output terminal 135, signal transmission lines 136 for making connection thereamong and so forth.

A local oscillator 14 for generating a local oscillating signal and an electric power source circuit 15 are located in the region C of the substrate 11 between the region A and the region B. A signal transmission line 141a is located in order to connect the local oscillator 14 and the mixer 123 of the transmitter circuit 12 while a signal transmission line 141b serves to connect the local oscillator 14 and the mixer 133 of the receiver circuit 13. A bias voltage is supplied from the electric power source circuit 15 to the amplifier 122, the mixer 123 and the amplifier 124 constituting the transmitter circuit 12 and the amplifier 132, the mixer 133 and the amplifier 134 constituting the receiver circuit 13.

In the configuration as described above, a transmission signal is input to the transmitter circuit 12 through the input terminal 121 and is amplified by the amplifier 122. Thereafter, the transmission signal is input to the mixer 123 and is mixed with the local oscillating signal as supplied from the local oscillator 14 in order to be transmitted at a higher transmission frequency. The transmission signal after the frequency conversion is amplified by the amplifier 124 and outputted through the ouput terminal 125.

The received signal is input from the input terminal 131 to the receiver circuit 13, amplified by the amplifier 132 and input to the mixer 133. The received signal is mixed with the local oscillating signal as generated by the local oscillator 14 and subjected to the frequency conversion in order to receive at a lower reception frequency. The received signal after the frequency conversion is outputted through the ouput terminal 135.

In accordance with the configuration as described above, the transmitter circuit 12 is located in one side of the substrate 11; the receiver circuit 13 is located in the opposite side of the substrate 11; and the local oscillator 14 and the electric power source circuit 15 are located in the center position therebetween. In this case, since the local oscillator 14 and the electric power source circuit 15 are located between the transmitter circuit 12 and the receiver circuit 13, there is formed effective isolation configuration between the transmitter circuit 12 and the receiver circuit 13. On the other hand, the receiver/transmitter apparatus consisting of the transmitter circuit 12, the receiver circuit 13, the local oscillator 14 and the electric power source circuit 15 are formed on the common substrate 11. Because of this, the receiver/transmitter apparatus can be manufactured in a compact design with a reduced number of constituent parts.

The receiver/transmitter apparatus can formed on a common substrate having rear surface on which a ground electrode is formed. However, the receiver/transmitter apparatus can be formed on a substrate on whose opposite surfaces ground electrodes are formed. Also, in this case, the transmitter circuit is located in one side of the substrate; the receiver circuit is located in the opposite side of the substrate; and the local oscillator and the electric power source circuit are located in the center position.

Meanwhile, in accordance with the embodiment as described above, both the local oscillator and the electric power source circuit are located in the region between the transmitter circuit and the receiver circuit. However, it is possible to provide only the local oscillator located in the region.

As described above, in accordance with the present invention, the local oscillator and the electric power source circuit are located between the transmitter circuit and the receiver circuit. For this reason, even in the case that there is a substantial differential level between the transmission electric power and the reception electric power, it is possible to sufficiently isolate the transmitter circuit and the receiver circuit from each other. Furthermore, it is possible to realize the receiver/transmitter apparatus which posseses excellent electric characteristics is advantageous in the massproductivity and the miniaturization.

Another embodiment in accordance with the present invention will be explained with reference to FIG. 3 which is a schematic plan view showing the structure of the embodiment. The reference 10 designates a circuit board structure. The circuit board structure is composed of a multilayer substrate 11 which is implemented with necessary circuitry for realizing the operation of the receiver/transmitter device. The multilayer substrate 11 is segmented in three regions, i.e., regions A and B located in the upper and lower positions in the figure and a region C located in the center and, for example, mounted upon a casing (not shown in the figure).

Provided upon the region A of the substrate is a transmitter circuit 12. The transmitter circuit 12 is composed of an input terminal 121, an amplifier 122, a mixer 123, an amplifier 124, an output terminal 125, signal transmission lines 126 for making connection thereamong and so forth.

Provided upon the region B of the substrate is a receiver circuit 13. The receiver circuit 13 is composed of an input terminal 131, an amplifier 132, a mixer 133, an amplifier 134, an output terminal 135, signal transmission lines 136 for making connection thereamong and so forth.

A local oscillator 14 for generating a local oscillating signal is located in the region C of the substrate. A signal transmission line 141a is located in order to connect the local oscillator 14 and the mixer 123 of the transmitter circuit 12 while a signal transmission line 141b serves to connect the local oscillator 14 and the mixer 133 of the receiver circuit 13.

A plurality of through holes are formed through the substrate in the form of a through hole sequence T1 which is extending from the left side of the substrate on which the input terminal 121 is located to the signal transmission line 141a. Also, a plurality of through holes are formed through the substrate in the form of a through hole sequence T2 which is extending from the right side of the substrate on which the output terminal 125 is located to the signal transmission line 141a. The region A and the region C are sectioned by means of the through hole sequences T1 and T2.

A plurality of through holes are formed through the substrate in the form of a through hole sequence RI which is extending from the right side of the substrate on which the input terminal 131 is located to the signal transmission line 141a. Also, a plurality of through holes are formed through the substrate in the form of a through hole sequence R2 which is ending from the left side of the substrate on which the output terminal 135 is located to the signal transmission line 141b. The region A and the region C are sectioned by means of the through hole sequences R1 and R2.

Furthermore, through hole sequences L1 and L2 are formed in order to surround the local oscillator 14 in the region C.

The through hole sequences T1, T2, R1, R2, L1 and L2 are composed respectively of a plurality of through holes passing through the substrate in order to make connection with the ground electrode which are formed on the both sides of the substrate.

In the configuration as described above, a transmission signal is input to the transmitter circuit 12 through the input terminal 121 and is amplified by the amplifier 122. Thereafter, the transmission signal is input to the mixer 123 and is mixed with the local oscillating signal as supplied from the local oscillator 14 in order to be transmitted at a higher transmission frequency. The transmission signal after the frequency conversion is amplified by the amplifier 124 and outputted through the ouput terminal 125.

The received signal is input from the input terminal 131 to the receiver circuit 13, amplified by the amplifier 132 and input to the mixer 133. The received signal is mixed with the local oscillating signal, generated by the local oscillator 14 and subjected to the frequency conversion in order to receive at a lower reception frequency. The received signal after the frequency conversion is outputted through the ouput terminal 135.

Figure 3:
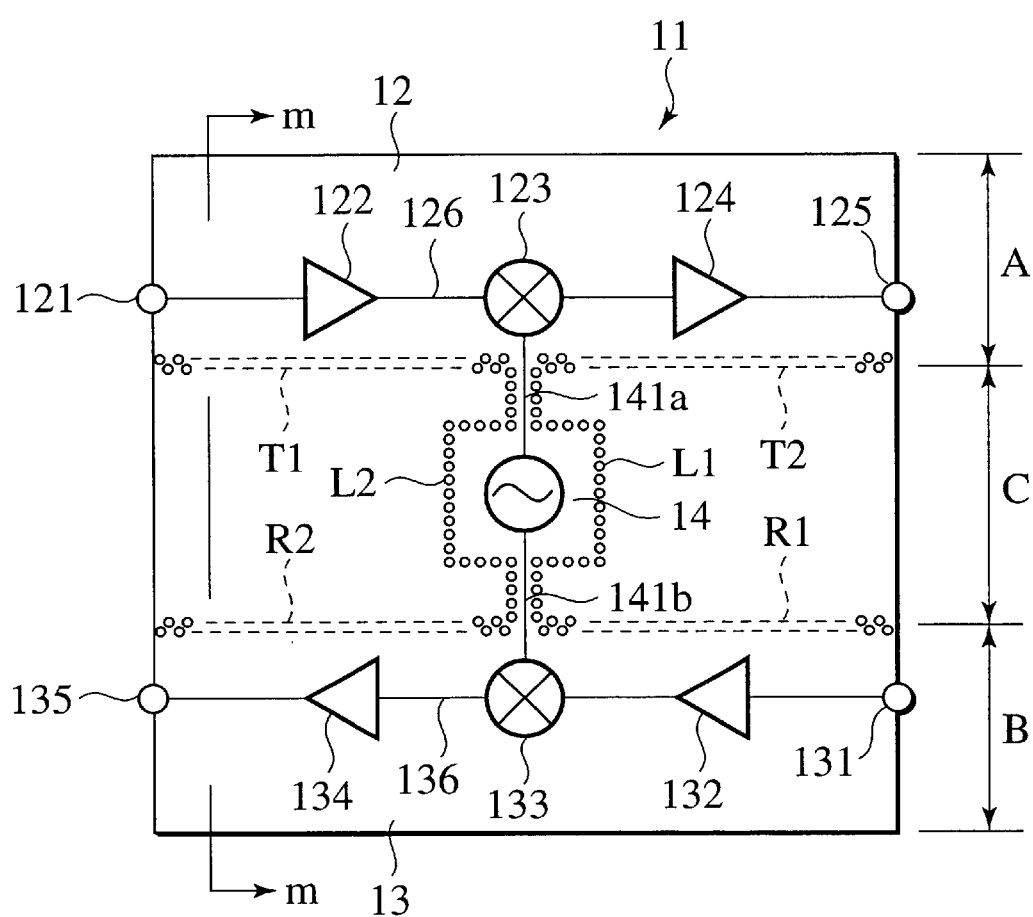
FIG. 3 is a schematic plan view for explaining a receiver/transmitter apparatus in accordance with another embodiment the present invention.
Figure 4:
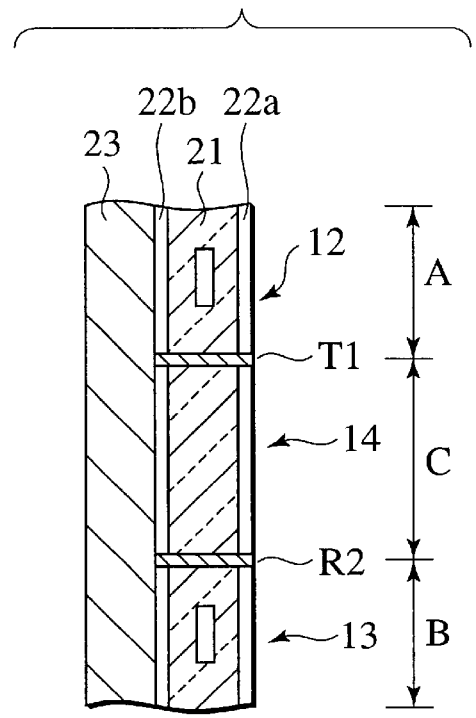
FIG. 4 is a partial cross sectional view of a receiver/transmitter apparatus in accordance with an embodiment the present invention.

Here, the structure of the circuit board structure 11 will be explained with reference to FIG. 4 which is a cross sectional view along the line m-m as illustrated in FIG. 3. In FIG. 4, like reference numbers indicate similar elements as illustrated in FIG. 3, and therefore redundant explanation is not repeated. The circuit board structure 21 is mounted on a case 23 and composed of a substrate 21, ground electrodes 22a and 22b formed on opposite surfaces of the substrate 21, through hole sequences T1 and R2 serving to make connection of the two ground electrodes 22a and 22b with each other.

In the configuration as described above, the transmitter circuit 12 is formed in the region A of the substrate 21 surrounded by the two ground electrodes 22a and 22b and the through hole sequence T1 while the receiver circuit 13 is formed in the region B of the substrate 21 surrounded by the two ground electrodes 22a and 22b and the through hole sequence R2. Although not shown in FIG. 4, the local oscillator 14 is formed in the region C.

In accordance with the configuration as described above, the receiver/transmitter apparatus is composed of the transmitter circuit 12, the receiver circuit 13, the local oscillator 14 and so forth and formed on a common 20 substrate 21. Because of this, the receiver/transmitter apparatus can be minituarized with a reduced number of constituent parts. Also, the through hole sequences are provided between the transmitter circuit 12 and the local oscillator 14 and between the receiver circuit 13 and the local oscillator 14, there is established an effective isolation configuration among the respective circuits.

Figure 5:
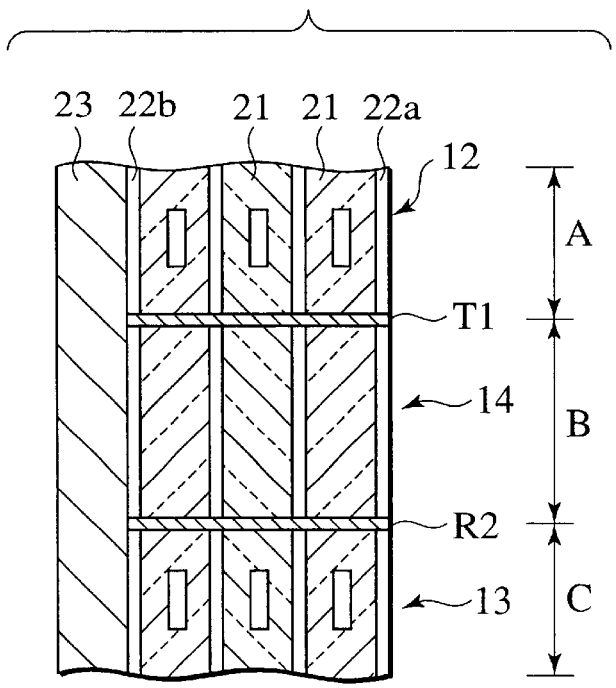
FIG. 5 is a partial cross sectional view of a receiver/transmitter apparatus in accordance with another embodiment the present invention.

Next, a further embodiment of the present invention will be explained with reference to FIG. 5 which is a schematic cross sectional view of the embodiment. In FIG. 5, like reference numbers indicate similar elements as illustrated in FIG. 3 and FIG. 4, and therefore redundant explanation is not repeated.

In the case of the embodiment, the circuit board structure 11 consisting of the transmitter circuit 12, the receiver circuit 13 and the local oscillator 14 are formed on a plurality of the layers 11a to 11c while the circuit board structure 11c is formed on the case 23. In this case, however, since the circuit board structure 11 are formed of a plurality of sublayers so that further miniatuarization becomes possible. In this case, for example, the multilayered structure of the circuit board structure 11 may be utilized in order that the uppermost layer is devoted to transfer direct current signals, that the intermediate layer is devoted to transfer intermediate frequency current signals and that the lowest layer is devoted to transfer high frequency current signals.

Figure 6:
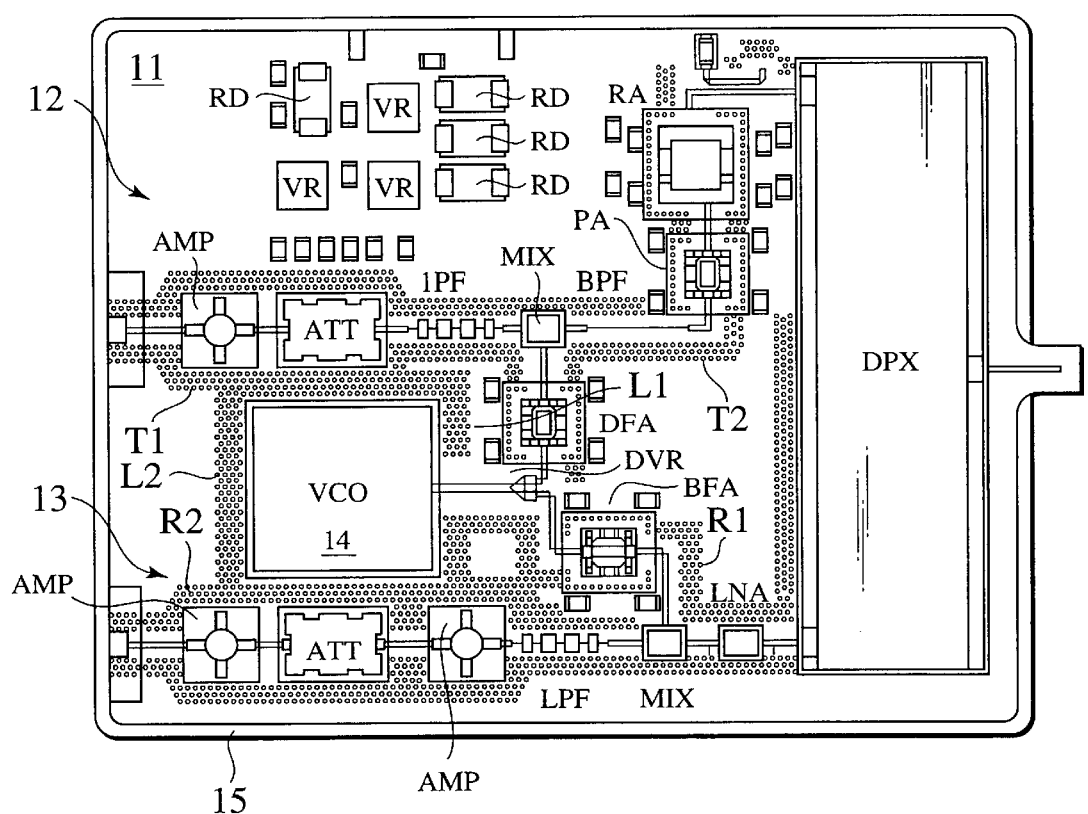
FIG. 6 is a plan view of a receiver/transmitter apparatus in accordance with an embodiment the present invention.

FIG. 6 is an external view showing the actual layout of a practical receiver/transmitter device in accordance with this embodiment. For example, the base structure 15 is made up of copper in the form of a shallow bathtub in which the substrate as illustrated in FIG. 3 is attached to. In the figure, there is illustrated the circuit board structure 11 consisting of the transmitter circuit 12 (a voltage-controlled oscillator), the receiver circuit 13 and the local oscillator 14 as well as some auxiliary circuits which are not explained since they are not important. Also, there are formed the through holes sequences T1, T2, R1, R2, L1 and L2 in order to section the transmitter circuit 12, the receiver circuit 13 and the local oscillator 14.

As explained above, in accordance with the configuration of the present invention, the transmitter circuit, the receiver circuit and the local oscillator are formed on a common substrate between the ground electrodes and segmented by means of the through hole sequences. For this reason, even in the case that there is a substantial differential level between the transmission electric power and the reception electric power, it is possible to effectively isolate the circuits from each other. As a result, it is possible to realize the receiver/transmitter apparatus which is advantageous in the mass productivity and the miniaturization.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. A receiver/transmitter apparatus comprising:
   a substrate having a rear surface on which a first ground electrode is formed;
   an oscillator formed on a front surface of said substrate and configured to generate an oscillating signal;
   a transmitter formed on said front surface of said substrate and having a first mixer configured to mix a transmission signal and said oscillating signal; and
   a receiver circuit formed on said front surface of said substrate and having a second mixer configured to mix a received signal and said oscillating signal,
   wherein said oscillator is arranged in a position between said transmitter circuit and said receiver circuit in order to lessen interference between said transmitter circuit and said receiver circuit.

2. The receiver/transmitter apparatus as claimed in claim 1, wherein an electric power source circuit configured to supply a bias voltage to the transmitter circuit, the oscillator and the receiver circuit is formed on said front surface of said substrate between said transmitter circuit and said receiver circuit.

3. The receiver/transmitter apparatus as claimed in claim 1, wherein a second ground electrode is formed on said front surface of said substrate.

4. The receiver/transmitter apparatus as claimed in claim 1, wherein a second ground electrode is formed on said front surface of said substrate,
   a plurality of through holes are formed through said substrate, said ground electrode, and said second ground electrode, between said transmitter circuit and said receiver circuit to isolate said transmitter circuit from said receiver circuit, and
   said plurality of through holes connect said first ground electrode to said second ground electrode.

5. The receiver/transmitter apparatus as claimed in claim 1 wherein said substrate is composed of a plurality of sublayers each of which has a principal surface on which a ground electrode is formed and a rear surface on which a ground electrode is formed, and wherein a signal transmission line is provided in each sublayer for transferring the transmission signal and/or the received signal.

6. A receiver/transmitter apparatus comprising:
   a substrate having a rear surface on which a first ground electrode is formed;
   an oscillator formed on a front surface of said substrate and configured to generate an oscillating signal;
   a transmitter formed on said front surface of said substrate and having a first mixer configured to mix a transmission signal and said oscillating signal; and
   a receiver circuit formed on said front surface of said substrate and having a second mixer configured to mix a received signal and said oscillating signal,
      wherein a plurality of through holes are formed through said substrate in the form of a through hole sequence connected to said first ground electrode in order to section said substrate into said first and second substrate regions and establish an effective isolation between first and second substrate regions, and
   wherein said transmitter circuit and said receiver circuit are located in said first and second substrate regions, respectively.

7. The receiver/transmitter apparatus as claimed in claim 6, wherein said through hole sequence defines a third substrate region similar to said first and second substrate regions, and wherein said oscillator, said transmitter circuit and said receiver circuit are located in said third, first and second substrate regions, respectively, and are isolated from each other by said through hole sequences.

8. The receiver/transmitter apparatus as claimed in claim 6, wherein an electric power source circuit configured to supply a bias voltage to the transmitter circuit, the oscillator and the receiver circuit is formed on said front surface of said substrate between said transmitter circuit and said receiver circuit.

9. The receiver/transmitter apparatus as claimed in claim 6, wherein said through hole sequence is formed along a signal transmission line through which the transmission signal or the received signal are transmitted.

10. The receiver/transmitter apparatus as claimed in claim 6, wherein said through hole sequence is extending to reach to a vicinity of one edge of said substrate.

11. The receiver/transmitter apparatus as claimed in claim 6, wherein said through hole sequence is extending to reach to vicinities of opposite edges of said substrate.

12. The receiver/transmitter apparatus as claimed in claim 6, wherein a second ground electrode is formed on said front surface of said substrate.

13. The receiver/transmitter apparatus as claimed in claim 6, wherein a second ground electrode is formed on said front surface of said substrate,
   a plurality of through holes are formed through said substrate, said first ground electrode, and said second ground electrode, between said transmitter circuit and said receiver circuit to isolate said transmitter circuit from said receiver circuit, and
   said plurality of through holes connect said first ground electrode to said second ground electrode.

14. The receiver/transmitter apparatus as claimed in claim 6 wherein said substrate is composed of a plurality of sublayers each of which has a principal surface on which a ground electrode is formed and a rear surface on which a ground electrode is formed, and wherein a signal transmission line is provided in each sublayer for transferring the transmission signal and/or the received signal.

15. A receiver/transmitter apparatus comprising:
   a substrate having a rear surface on which a first ground electrode is formed;
   an oscillator formed on a front surface of said substrate and configured to generate an oscillating signal;
   a transmitter formed on said front surface of said substrate and having a first mixer configured to mix a transmission signal and said oscillating signal; and
   a receiver circuit formed on said front surface of said substrate and having a second mixer configured to mix a received signal and said oscillating signal,
   wherein the first mixer of said transmitter circuit and the second mixer of said receiver circuit are positioned in opposite locations of said substrate to each other with said oscillator intervening between the first mixer of said transmitter circuit and the second mixer of said receiver circuit.

16. The receiver/transmitter apparatus as claimed in claim 15, wherein a second ground electrode is formed on said front surface of said substrate.

17. The receiver/transmitter apparatus as claimed in claim 15, wherein a second ground electrode is formed on said front surface of said substrate,
   a plurality of through holes are formed through said substrate, said first ground electrode, and said second ground electrode, between said transmitter circuit and said receiver circuit to isolate said transmitter circuit from said receiver circuit, and
   said plurality of through holes connect said first ground electrode to said second ground electrode.

18. The receiver/transmitter apparatus as claimed in claim 15 wherein said substrate is composed of a plurality of sublayers each of which has a principal surface on which a ground electrode is formed and a rear surface on which a ground electrode is formed, and wherein a signal transmission line is provided in each sublayer for transferring the transmission signal and/or the received signal.

19. The receiver/transmitter apparatus as claimed in claim 15, wherein an electric power source circuit configured to supply a bias voltage to the transmitter circuit, the oscillator and the receiver circuit is formed on said front surface of said substrate between said transmitter circuit and said receiver circuit.

* * * * *